(12) United States Patent
Qian et al.

(10) Patent No.: US 11,835,567 B2
(45) Date of Patent: Dec. 5, 2023

(54) METHOD FOR ASSEMBLING ULTRAHIGH-FREQUENCY SPRING PROBE TEST ASSEMBLY

(71) Applicant: SUZHOU UIGREEN MICRO&NANO TECHNOLOGY CO. LTD., Suzhou (CN)

(72) Inventors: Xiaochen Qian, Suzhou (CN); Hongyi Cai, Suzhou (CN)

(73) Assignee: SUZHOU UIGREEN MICRO&NANO TECHNOLOGY CO. LTD., Suzhou (CN)

( * ) Notice: Subject to any disclaimer, the term of this patent is extended or adjusted under 35 U.S.C. 154(b) by 296 days.

(21) Appl. No.: 17/481,251

(22) Filed: Sep. 21, 2021

(65) Prior Publication Data

US 2022/0196707 A1  Jun. 23, 2022

Related U.S. Application Data

(63) Continuation of application No. PCT/CN2021/082051, filed on Mar. 22, 2021.

(30) Foreign Application Priority Data

Dec. 18, 2020  (CN) .......................... 202011500446.2

(51) Int. Cl.
*G01R 3/00* (2006.01)
*G01R 1/06* (2006.01)
*G01R 1/067* (2006.01)

(52) U.S. Cl.
CPC .......... *G01R 3/00* (2013.01); *G01R 1/06722* (2013.01); *G01R 1/06772* (2013.01)

(58) Field of Classification Search
CPC .. G01R 3/00; G01R 1/06772; G01R 1/06722; G01R 1/07314; G01R 1/045; G01R 1/466; G01R 1/483
See application file for complete search history.

(56) References Cited

U.S. PATENT DOCUMENTS

| 11,221,348 B2 * | 1/2022 | Zhou ...................... G01R 1/045 |
| 2010/0062629 A1 * | 3/2010 | Feldman ............ G01R 31/2889 439/219 |

(Continued)

FOREIGN PATENT DOCUMENTS

| CN | 109148412 A | * | 1/2019 | ......... H01L 21/4846 |
| CN | 111094998 A | * | 5/2020 | ........... G01R 1/0408 |

(Continued)

*Primary Examiner* — Bayan Salone
(74) *Attorney, Agent, or Firm* — SZDC LAW P.C.

(57) ABSTRACT

A method for assembling an ultrahigh-frequency spring probe test assembly includes: drilling signal cavities, power supply cavities, and grounding cavities, assembling an upper mold core and a lower mold core and performing curing, mounting an upper shaft sleeve and a lower shaft sleeve, inserting a signal probe, a power supply probe and a grounding probe, and mounting an upper base to complete assembling the probe test assembly. The signal probe becomes coaxial with the signal cavity by mounting the insulating ring, achieving small signal loss; the insulating mold core is inserted into the power supply cavity after drilling and is bonded to the power supply cavity via adhesive to form a dual-layer insulating structure between the power supply probe and the base, having high insulation performance and low power loss; the grounding probe is in direct contact with the metal base, achieving high conductivity.

7 Claims, 6 Drawing Sheets

(56) References Cited

U.S. PATENT DOCUMENTS

2017/0059611 A1* 3/2017 Lesnikoski ............ G01R 1/045
2020/0088763 A1* 3/2020 Zhou ...................... G01R 1/045

FOREIGN PATENT DOCUMENTS

CN   112240947 A  *  1/2021   ......... G01R 1/06722
CN   214845411 U  *  11/2021

* cited by examiner

METHOD FOR ASSEMBLING ULTRAHIGH-FREQUENCY SPRING PROBE TEST ASSEMBLY

This application is the Continuation Application of PCT/CN2021/082051, filed on Mar. 22, 2021, which claims priority to Chinese Patent Application No. 202011500446.2, filed on Dec. 18, 2020, which is incorporated by reference for all purposes as if fully set forth herein.

TECHNICAL FIELD

The present invention relates to the technical field of semiconductor components, in particular to a method for assembling an ultrahigh-frequency spring probe test assembly.

BACKGROUND

Currently, technologies related to spring probes and bases for testing chips are mostly controlled by Japan, South Korea, America and other countries. The majority of domestic products are still middle and low-end products and have lower technical merits and additional values. Accordingly, tests of high-frequency chips and radio-frequency chips still stay in an initial stage. A large number of miniature high-performance spring test probes are needed in the process of testing high-reliability chips during production and manufacturing. Therefore, developing a novel spring probe and base test assembly applicable to tests on ultrahigh-frequency chips can fill the gap in such tests in China. This technology will promote research and development of domestic chips and development of the testing industry, and help remove dependence on test probe products from Europe, America, Japan, South Korea, and other countries. It plays a critical demonstration and promotion role in boosting the regional chip manufacturing industry and even the chip production and test technologies in China to advance towards an international leading level.

An existing spring test probe is usually used in combination with a plastic base, but they are non-coaxial structures. In addition, the existing spring test probe does not take into account the input/output impedance matching of a chip. As a result, high-frequency performance is limited by a transmission bandwidth of the probe, signal and power loss is severe, and thus the test effect is greatly affected. Most of existing ultrahigh-frequency probe test assemblies have a three-layer base structure. Therefore, these assemblies are complex and slow to assemble, and have poor signal probe coaxial performance. Moreover, power supply probe cavities on existing test bases are mostly directly electroplated with an insulating layer after being drilled. Consequently, other parts of the base will also easily electroplated, and an electroplating process is complex and an assembling cost is high. An inner wall of a power supply cavity cannot be effectively insulated, and ultrahigh-frequency signal tests at 55 GHz or above are difficult to carry out.

SUMMARY

An objective of the present invention is to provide a method for assembling an ultrahigh-frequency spring probe test assembly, to solve the problems in the background above.

To achieve the above objective, the present invention provides the following technical solution: Disclosed is a method for assembling an ultrahigh-frequency spring probe test assembly. The method includes the following steps:

step 1: preparing a base material that includes an upper base, a lower base, an upper shaft sleeve, a lower shaft sleeve, an upper mold core, a lower mold core, a signal probe, a power supply probe, and a grounding probe;

step 2: drilling a plurality of side-by-side mutually-corresponding upper signal cavities, lower signal cavities, upper power supply cavities, lower power supply cavities, upper grounding cavities, and lower grounding cavities separately in the upper base and the lower base, where the upper signal cavity and the lower signal cavity form a signal cavity, the upper power supply cavity and the lower power supply cavity form a power supply cavity, and the upper grounding cavity and the lower grounding cavity form a grounding cavity;

step 3: inserting the upper mold core into the upper power supply cavity, and inserting the lower mold core into the lower power supply cavity;

step 4: injecting adhesive into a gap between the upper mold core and the upper power supply cavity and a gap between the lower mold core and the lower power supply cavity, and waiting for curing;

step 5: drilling the cured upper mold core and lower mold core;

step 6: mounting the lower shaft sleeve into the lower signal cavity, inserting the signal probe into the lower shaft sleeve, and mounting the upper shaft sleeve into the upper signal cavity;

step 7: inserting the power supply probe into a pore space of the lower mold core;

step 8: inserting the grounding probe into the lower grounding cavity; and step 9: respectively aligning the signal probe, the power supply probe, and the grounding probe with the upper signal cavity, the pore space of the upper mold core, and the upper grounding cavity in the upper base and inserting these probes into the corresponding cavities respectively, and fitting and fixing a lower surface of the upper base with an upper surface of the lower base, where Further, preferably, the upper base and the lower base are both made of a metal material.

Further, preferably, the upper shaft sleeve, the lower shaft sleeve, the upper mold core, and the lower mold core are all made of a nonmetallic insulating material.

Further, preferably, an outer diameter of the upper mold core is less than an inner diameter of the upper power supply cavity, and an outer diameter of the lower mold core is less than an inner diameter of the lower power supply cavity.

Further, preferably, the upper mold core and the upper power supply cavity have the same height, and the lower mold core and the lower power supply cavity have the same height.

Further, preferably, the upper shaft sleeve and the lower shaft sleeve are respectively press-fit into the upper signal cavity and the lower signal cavity through interference fit.

Further, preferably, the signal probe, the power supply probe, and the grounding probe each include an upper plunger, a lower plunger, a sleeve, and a spring, and an insulating ring is sleeved on the sleeve of the signal probe.

Further, preferably, an inner diameter of the signal cavity is greater than an outer diameter of the signal probe.

Further, preferably, the bottoms of the upper shaft sleeve and the pore space of the upper mold core and the upper portions of the lower shaft sleeve and the pore space of the lower mold core each are provided with a guide taper angle.

Further, preferably, an outer diameter of the grounding probe is in interference fit with both the upper grounding cavity and the lower grounding cavity.

Beneficial Effects

According to the method for assembling an ultrahigh-frequency spring probe test assembly, the signal probe becomes coaxial with the signal cavity by mounting the insulating ring, achieving small signal loss; the insulating mold core is inserted into the power supply cavity after drilling and is bonded to the power supply cavity via adhesive to form a dual-layer insulating structure between the power supply probe and the base, having high insulation performance and low power loss; the grounding probe is in direct contact with the metal base, achieving high conductivity; and in addition, the spring probe test assembly prepared through the assembling method avoids excessive insertion loss and return loss of existing probes, widens the application scope of chip frequency tests and improves the chip test effect, and can better meet higher requirements for high-speed chip tests in the 5G and AI era, the assembling is simple, fast, and easy, and the mounting is orderly.

REFERENCE NUMERALS

1—upper base, 2—lower base, 3—upper signal cavity, 4—lower signal cavity, 5—upper power supply cavity, 6—lower power supply cavity, 7—upper shaft sleeve, 8—lower shaft sleeve, 9—upper mold core, 10—lower mold core, 11—upper grounding cavity, 12—lower grounding cavity, 13—signal probe, 14—power supply probe, 15—grounding probe, 16—sleeve, 17—upper plunger, 18—lower plunger, and 19—insulating ring.

DESCRIPTION OF EMBODIMENTS

The following provides specific embodiments of the present invention, and further describes the technical solution of the present invention with reference to the accompanying drawings. However, the present invention is not limited thereto.

Figure 1:
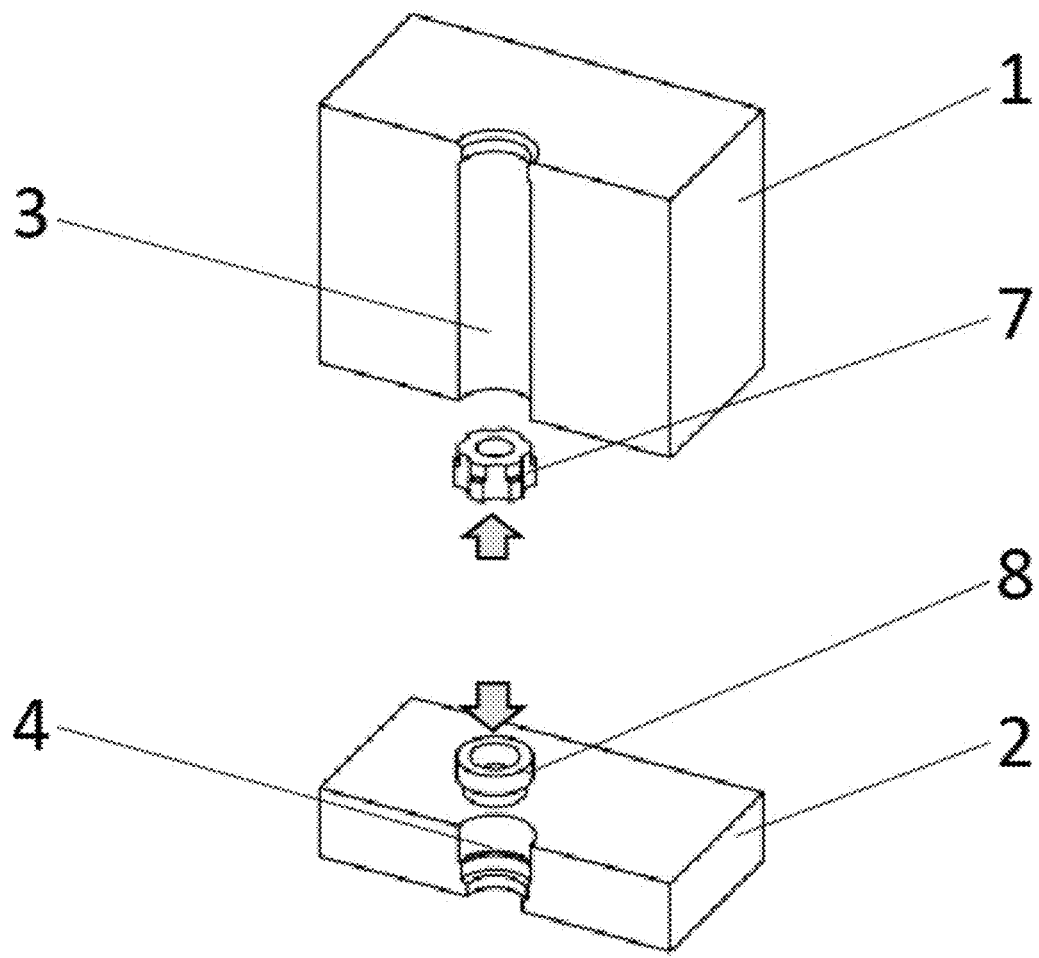
FIG. 1 is a schematic diagram of assembling an upper shaft sleeve and a lower shaft sleeve into a signal cavity disclosed according to an embodiment of the present invention.
Figure 2:
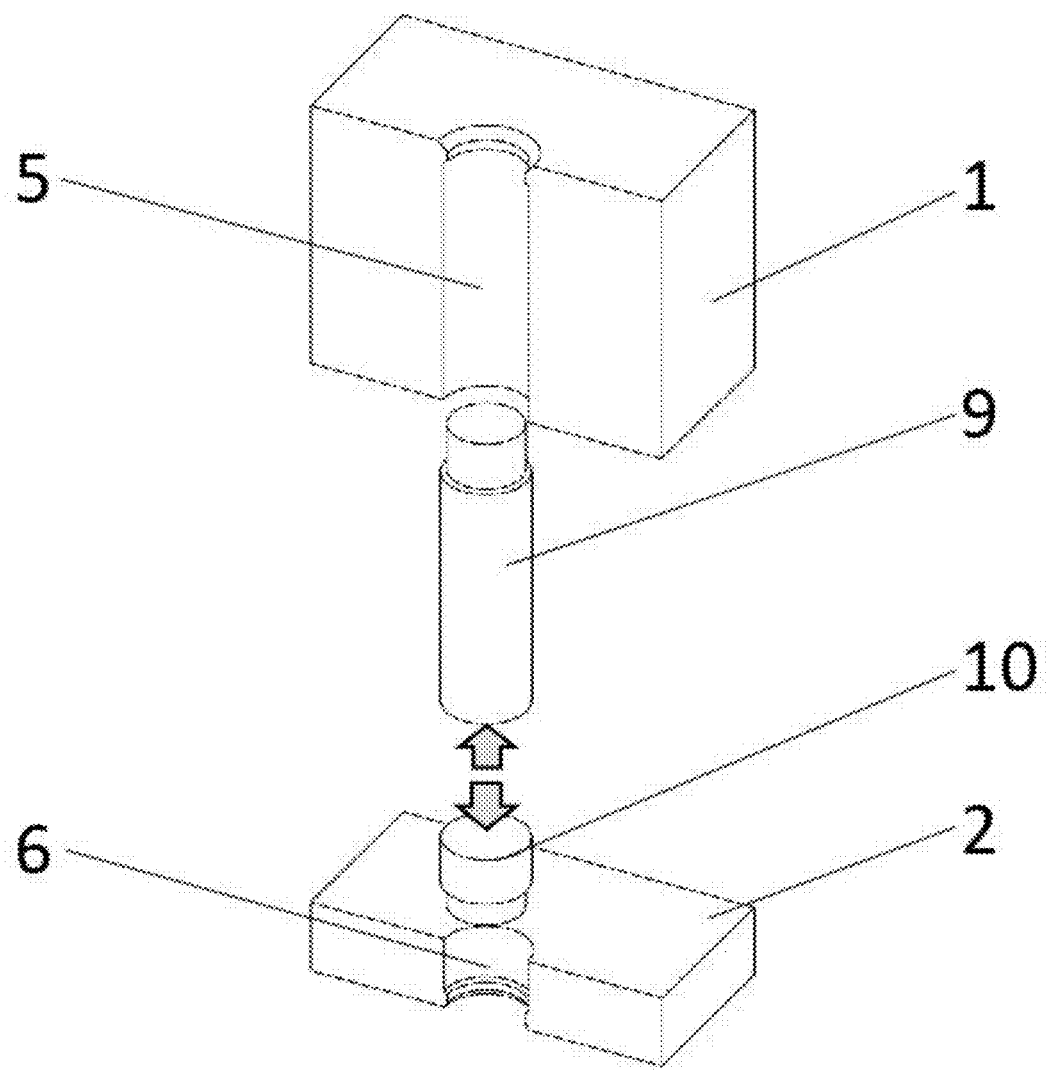
FIG. 2 is a schematic diagram of assembling an upper mold core and a lower mold core into a power supply cavity disclosed according to an embodiment of the present invention.
Figure 3:
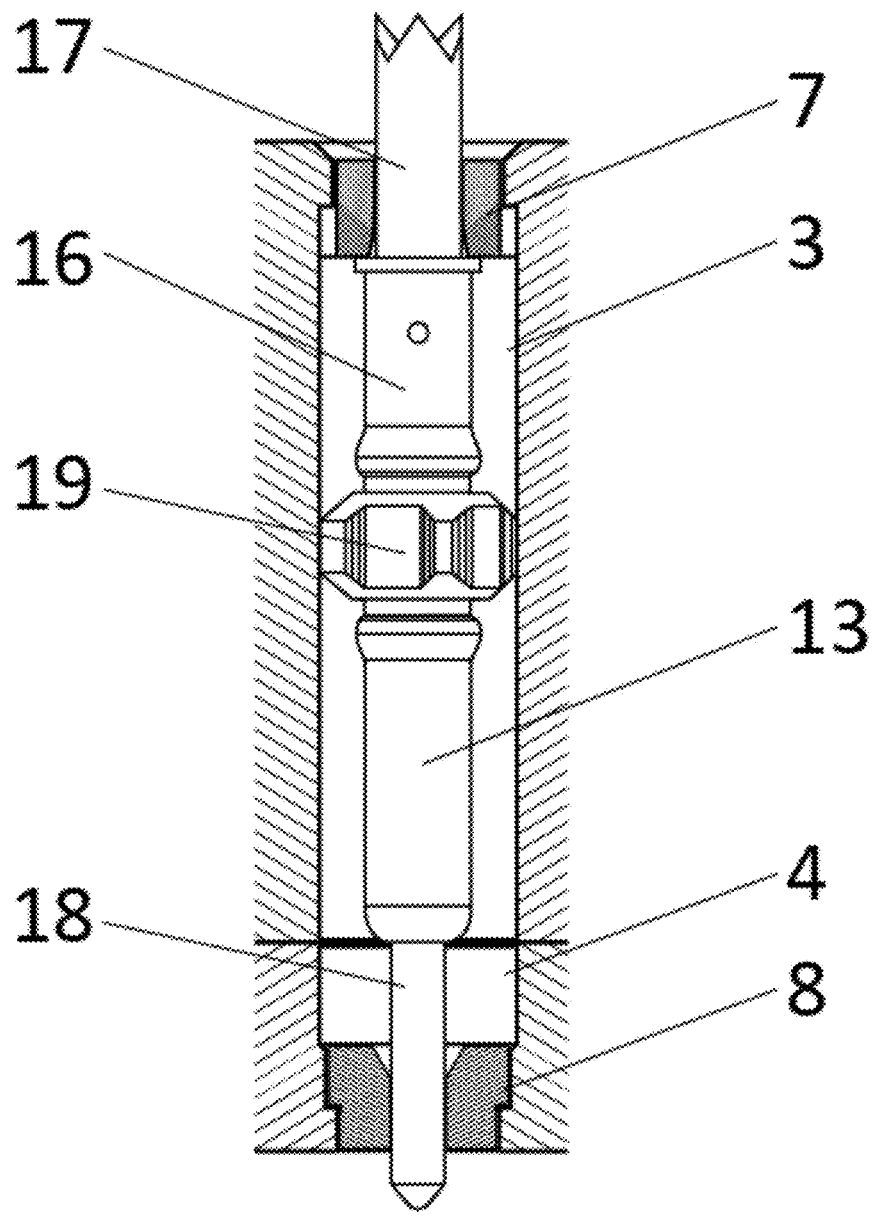
FIG. 3 is a schematic diagram of assembling a signal probe into a base disclosed according to an embodiment of the present invention.
Figure 4:
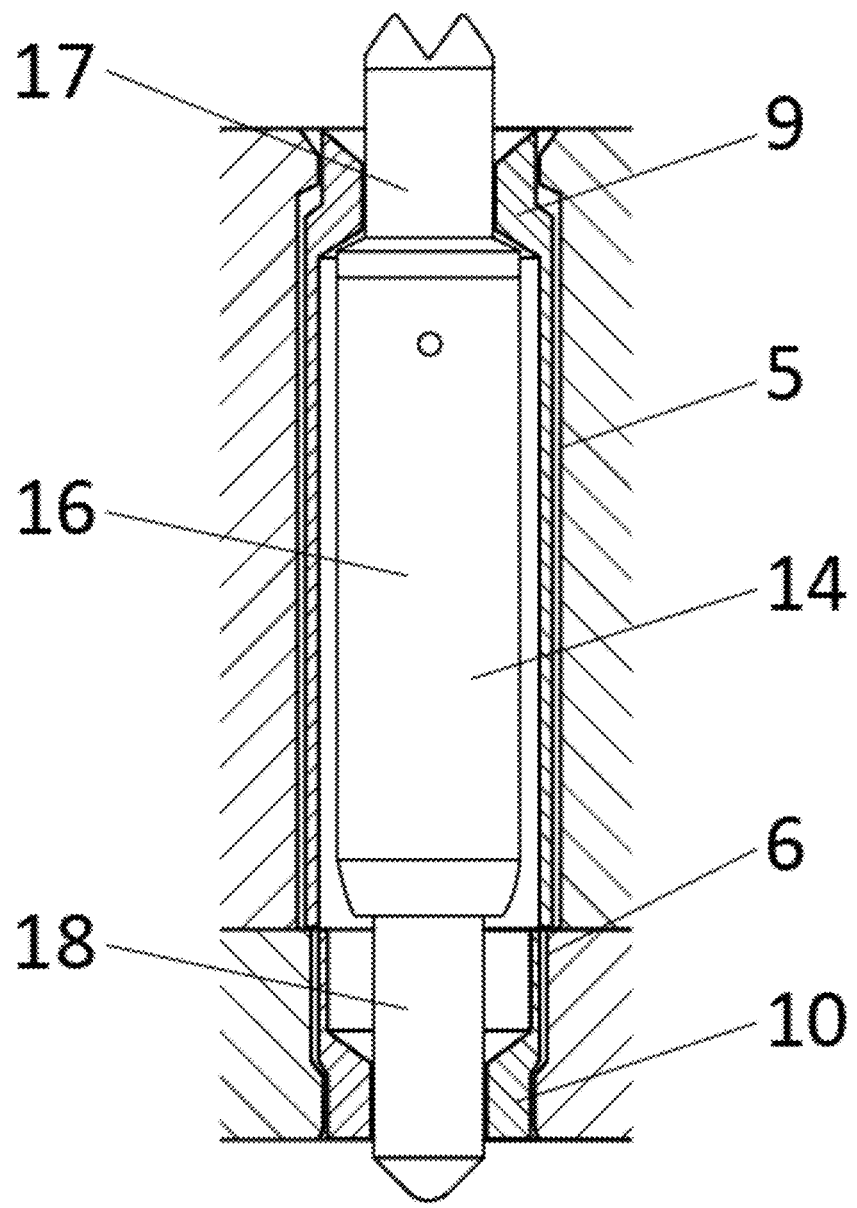
FIG. 4 is a schematic diagram of assembling a power supply probe into a base disclosed according to an embodiment of the present invention.
Figure 5:
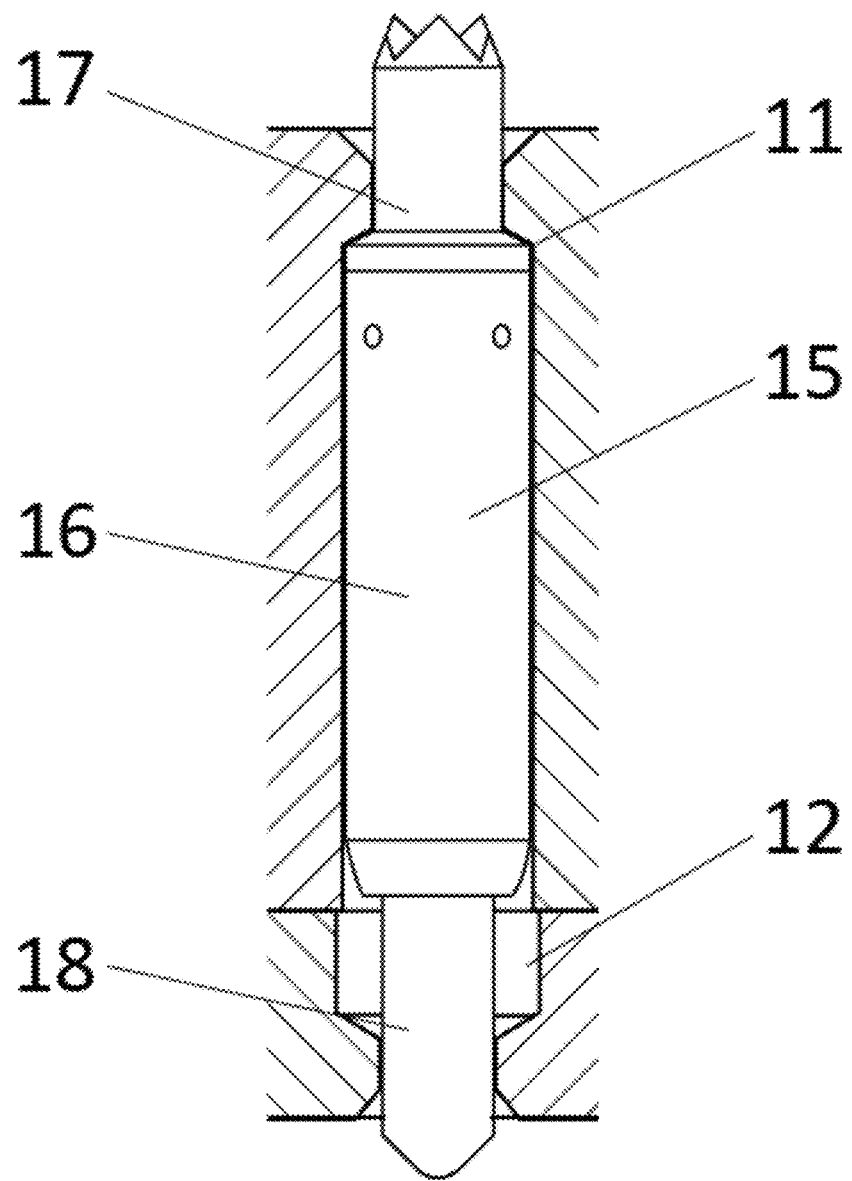
FIG. 5 is a schematic diagram of assembling a grounding probe into a base disclosed according to an embodiment of the present invention.
Figure 6:
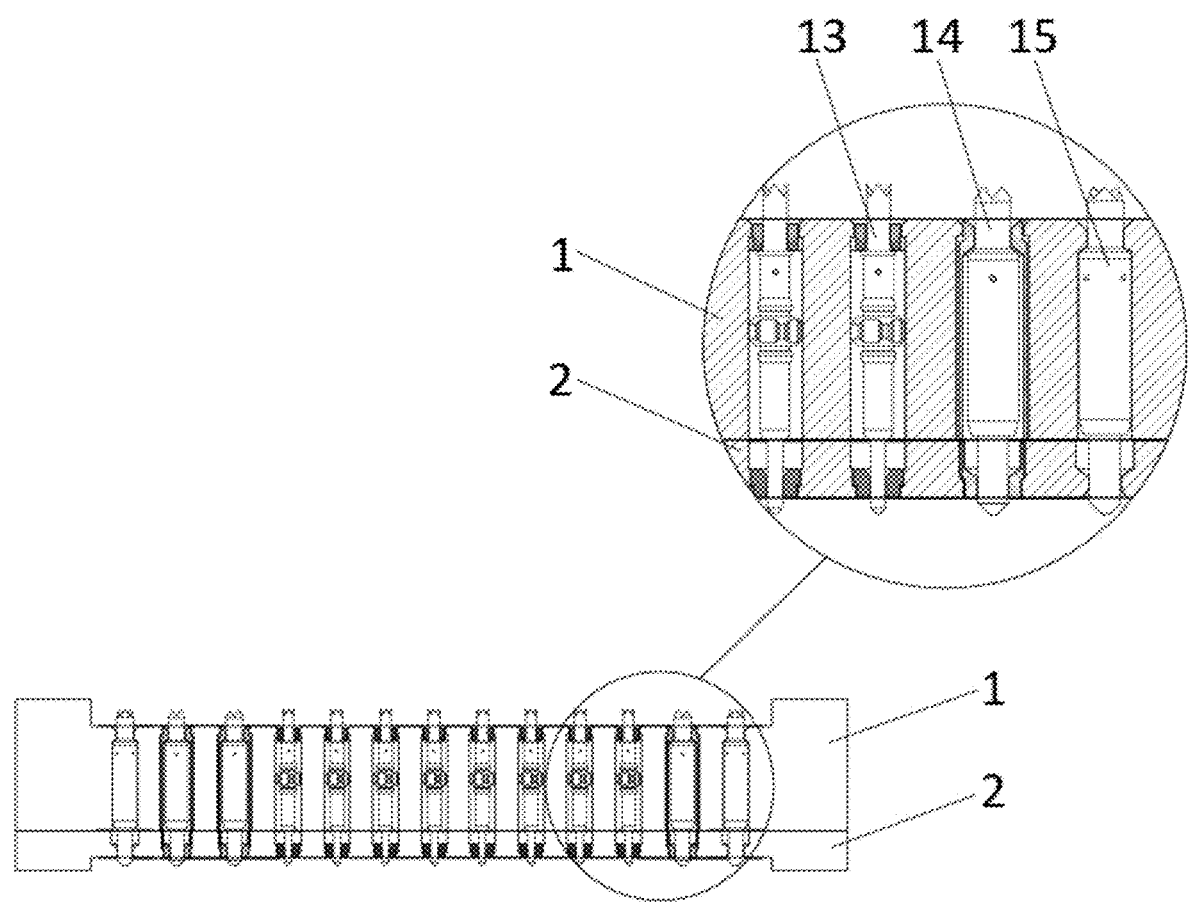
FIG. 6 is a schematic diagram of an overall structure of an ultrahigh-frequency spring probe test assembly disclosed according to an embodiment of the present invention.

As shown in FIG. 1 to FIG. 5, an ultrahigh-frequency spring probe test assembly includes an upper base 1, a lower base 2, a signal probe 13, a power supply probe 14, and a grounding probe 15, where the upper base 1 and the lower base 2 form a base of the test assembly, the upper base 1 is provided with the upper signal cavity 3, the upper power cavity 5, and the upper grounding cavity 11, the lower base 2 is provided with the lower signal cavity 4, the lower power supply cavity 6, and the lower grounding cavity 12, the upper signal cavity 3 and the lower signal cavity 4 form a signal cavity, the upper power supply cavity 5 and the lower power supply cavity 6 form a power supply cavity, and the upper grounding cavity 11 and the lower grounding cavity 12 form a grounding cavity. The signal probe 13 is mounted in the signal cavity, the power supply probe 14 is mounted in the power supply cavity, and the grounding probe 15 is mounted in the grounding cavity.

A method for assembling an ultrahigh-frequency spring probe test assembly in the present application includes the following steps:

Step 1: Prepare a base material that includes an upper base 1, a lower base 2, an upper shaft sleeve 7, a lower shaft sleeve 8, an upper mold core 9, a lower mold core 10, a signal probe 13, a power supply probe 14, and a grounding probe 15.

Step 2: Drill the upper signal cavities 3, the lower signal cavities 4, the upper power supply cavities 5, the lower power supply cavities 6, the upper grounding cavities 11, and the lower grounding cavities 12 separately in the upper base 1 and the lower base 2, where the cavities each are a circular-pore structure with a large-small diameter, the upper signal cavity 3, the upper power supply cavity 5, and the upper grounding cavity 11 each have a big-end-down aperture, and the lower signal cavity 4, the lower power supply cavity 6, and the lower grounding cavity 12 each have a big-end-up aperture.

Step 3: Insert the upper mold core 9 into the upper power supply cavity 5, and insert the lower mold core 10 into the lower power supply cavity 6.

Step 4: Inject adhesive into a gap between the upper mold core 9 and the upper power supply cavity 5 and a gap between the lower mold core 10 and the lower power supply cavity 6, and wait for curing, where a side face of the cured upper mold core 9 is bonded to an inner wall of the upper power supply cavity 5, and a side face of the cured lower mold core 10 is bonded to an inner wall of the lower power supply cavity 6.

Step 5: Drill the cured upper mold core 9 and lower mold core 10, where pore spaces run through the upper mold core 9 and the lower mold core 10 in the vertical direction and each are a circular-pore structure with a large-small diameter.

Step 6: Mount the lower shaft sleeve 8 into the lower signal cavity 4 for the lower shaft sleeve 8 to be positioned at the lower end of the lower signal cavity 4, insert the signal probe 13 into the lower shaft sleeve 8, and mounting the upper shaft sleeve 7 into the upper signal cavity 3 for the upper shaft sleeve 7 to be positioned at the upper end of the upper signal cavity 3.

Step 7: Insert the power supply probe 14 into the pore space of the lower mold core 10.

Step 8: Insert the grounding probe 15 into the lower grounding cavity 12.

Step 9: Respectively align the signal probe 13, the power supply probe 14, and the grounding probe 15 with the upper signal cavity 3, the pore space of the upper mold core 9, and the upper grounding cavity 11 in the upper base 1 and insert these probes into the corresponding cavities respectively, and fit and fix a lower surface of the upper base 1 with an upper surface of the lower base 2 to complete assembling the probe test assembly.

The method for assembling the spring probe test assembly of the present application changes an existing method that adopts electroplating for insulating, simplifies an assembly process, makes the spring probe test assembly simpler and more rapid to assemble, avoid a poor conductivity of the grounding probe caused when other parts of the base are also electroplated during electroplating, and meanwhile saves an assembling cost.

Preferably, the upper base 1 and the lower base 2 are both made of a metal material, thereby making sure that the signal probe 13, the power supply probe 14 and the grounding probe 15 are fixed stably, facilitating machining and having long service lives.

Preferably, the upper shaft sleeve 7, the lower shaft sleeve 8, the upper mold core 9, and the lower mold core 10 are all made of a nonmetallic insulating material, to ensure that the signal probe 13 and the power supply probe 14 are insulated from the base, thereby preventing signal short circuit and electrical loss that are caused by contact with a base made of a metal material.

Preferably, an outer diameter of the upper mold core 9 is less than an inner diameter of the upper power supply cavity 5, and an outer diameter of the lower mold core 10 is less than an inner diameter of the lower power supply cavity 6, to ensure that a gap is reserved between the upper mold core 9 and the upper power supply cavity 5 and between the lower mold core 10 and the lower power supply cavity 6, so that adhesive can be injected into the gaps to bond the upper mold core 9 with the upper power supply cavity 5 and bond the lower mold core 10 with the lower power supply cavity 6.

Preferably, the upper mold core 9 and the upper power supply cavity 5 have the same height, and the lower mold core 10 and the lower power supply cavity 6 have the same height, to ensure that the power supply probe 14 is fully insulated from the power supply cavity, thereby preventing tests from being affected by conduction between the power supply probe 14 and the base and improving the insulating effects of the upper mold core 9 and the lower mold core 10.

Preferably, the upper shaft sleeve 7 and the lower shaft sleeve 8 are respectively press-fit into the upper signal cavity 3 and the lower signal cavity 4 through interference fit, to ensure that the upper shaft sleeve 7 and the lower shaft sleeve 8 are firmly fixed.

Preferably, the signal probe 13, the power supply probe 14, and the grounding probe 15 each include an upper plunger 17, a lower plunger 18, a sleeve 16, and a spring, an insulating ring 19 is sleeved on the sleeve 16 of the signal probe 13, and the insulating ring 19 is configured to fix the signal probe 13 and coordinate with the upper shaft sleeve 7 and the lower shaft sleeve 8, to ensure that the signal probe 13 is centered in the signal cavity and forms a coaxial structure jointly with the signal cavity. The spring (not shown in figure) is mounted inside the sleeve 16, and an upper end and a lower end of the spring abut against a lower end of the upper plunger 17 and an upper end of the lower plunger 18, respectively.

Preferably, the upper signal cavity 3 and the lower signal cavity 4 form the signal cavity, and an inner diameter of the signal cavity is greater than an outer diameter of the signal probe 13, so that a relatively large gap is reserved between the signal probe 13 and the signal cavity, and the air in the gap serves as an insulating medium.

Preferably, the bottoms of the upper shaft sleeve 7 and the pore space of the upper mold core 9 and the upper portions of the lower shaft sleeve 8 and the pore space of the lower mold core 10 each are provided with a guide taper angle, which facilitates insertion and assembling of the signal probe 13 and the power supply probe 14.

Preferably, an outer diameter of the grounding probe 15 is in interference fit with both the upper grounding cavity 11 and the lower grounding cavity 12, to ensure good conductivity between the grounding probe 15 and the grounding cavity.

Finally, it should be noted that, the descriptions provided above are merely example embodiments of the present invention, and are not intended to limit the present invention. Although the present invention is described in detail with reference to the preceding embodiments, a person skilled in the art may still modify the technical solutions described in the preceding embodiments or make equivalent replacements to some technical features therein. Any modifications, equivalent replacements, and improvements made within the spirit and principle of the present invention shall be included in the inventive content within the protection scope of the present invention.

What is claimed is:

1. A method for assembling an ultrahigh-frequency spring probe test assembly, comprising the following steps:
    step 1: preparing a base material that comprises an upper base, a lower base, an upper shaft sleeve, a lower shaft sleeve, an upper mold core, a lower mold core, a signal probe, a power supply probe, and a grounding probe;
    step 2: drilling a plurality of side-by-side mutually-corresponding upper signal cavities, lower signal cavities, upper power supply cavities, lower power supply cavities, upper grounding cavities, and lower grounding cavities separately in the upper base and the lower base, wherein the upper signal cavity and the lower signal cavity form a signal cavity, the upper power supply cavity and the lower power supply cavity form a power supply cavity, and the upper grounding cavity and the lower grounding cavity form a grounding cavity;
    step 3: inserting the upper mold core into the upper power supply cavity, and inserting the lower mold core into the lower power supply cavity;
    step 4: injecting adhesive into a gap between the upper mold core and the upper power supply cavity and a gap between the lower mold core and the lower power supply cavity, and waiting for curing;
    step 5: drilling the cured upper mold core and lower mold core;
    step 6: mounting the lower shaft sleeve into the lower signal cavity, inserting the signal probe into the lower shaft sleeve, and mounting the upper shaft sleeve into the upper signal cavity;
    step 7: inserting the power supply probe into a pore space of the lower mold core;
    step 8: inserting the grounding probe into the lower grounding cavity; and
    step 9: respectively aligning the signal probe, the power supply probe, and the grounding probe with the upper signal cavity, the pore space of the upper mold core, and the upper grounding cavity in the upper base and inserting these probes into the corresponding cavities respectively, and fitting and fixing a lower surface of the upper base with an upper surface of the lower base, wherein
    the upper base and the lower base are both made of a metal material; the upper shaft sleeve, the lower shaft sleeve, the upper mold core, and the lower mold core are all made of a nonmetallic insulating material; and an outer diameter of the upper mold core is less than an inner diameter of the upper power supply cavity, and an outer diameter of the lower mold core is less than an inner diameter of the lower power supply cavity.

2. The method for assembling an ultrahigh-frequency spring probe test assembly according to claim 1, wherein the upper mold core and the upper power supply cavity have the same height, and the lower mold core and the lower power supply cavity have the same height.

3. The method for assembling an ultrahigh-frequency spring probe test assembly according to claim 1, wherein the upper shaft sleeve and the lower shaft sleeve are respectively press-fit into the upper signal cavity and the lower signal cavity through interference fit.

4. The method for assembling an ultrahigh-frequency spring probe test assembly according to claim 1, wherein the signal probe, the power supply probe, and the grounding probe each include an upper plunger, a lower plunger, a sleeve, and a spring, an insulating ring is sleeved on the sleeve of the signal probe, and the insulating ring is in interference fit with the upper signal cavity.

5. The method for assembling an ultrahigh-frequency spring probe test assembly according to claim 1, wherein an inner diameter of the signal cavity is greater than an outer diameter of the signal probe.

6. The method for assembling an ultrahigh-frequency spring probe test assembly according to claim 1, wherein the bottoms of the upper shaft sleeve and the pore space of the upper mold core and the upper portions of the lower shaft sleeve and the pore space of the lower mold core each are provided with a guide taper angle.

7. The method for assembling an ultrahigh-frequency spring probe test assembly according to claim 1, wherein an outer diameter of the grounding probe is in interference fit with both the upper grounding cavity and the lower grounding cavity.

* * * * *